(12) United States Patent
Fukuzono et al.

(10) Patent No.: US 7,222,316 B2
(45) Date of Patent: May 22, 2007

(54) BOARD DESIGN AIDING APPARATUS, BOARD DESIGN AIDING METHOD AND BOARD DESIGN AIDING PROGRAM

(75) Inventors: Kenji Fukuzono, Kawasaki (JP); Hideaki Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 220 days.

(21) Appl. No.: 10/986,135

(22) Filed: Nov. 12, 2004

(65) Prior Publication Data
US 2006/0036978 A1 Feb. 16, 2006

(30) Foreign Application Priority Data
Aug. 11, 2004 (JP) .............................. 2004-234101

(51) Int. Cl.
*G06F 17/50* (2006.01)
*G01R 31/02* (2006.01)

(52) U.S. Cl. .............................. 716/4; 716/1; 324/537; 703/1

(58) Field of Classification Search .................... 716/1, 716/4, 15; 324/537; 703/1
See application file for complete search history.

(56) References Cited

U.S. PATENT DOCUMENTS

| | | | |
|---|---|---|---|
| 5,922,212 A * | 7/1999 | Kano et al. ..................... 216/2 |
| 7,069,095 B2 * | 6/2006 | Nelson et al. ................. 700/98 |
| 2003/0196181 A1 * | 10/2003 | Sano et al. ..................... 716/4 |
| 2004/0010766 A1 * | 1/2004 | Swope ......................... 716/15 |
| 2005/0008319 A1 * | 1/2005 | Cameron ..................... 385/145 |

FOREIGN PATENT DOCUMENTS

| | | |
|---|---|---|
| JP | 04-360274 | 12/1992 |
| JP | 10-093206 | 4/1998 |

* cited by examiner

*Primary Examiner*—Jack Chiang
*Assistant Examiner*—Magid Y. Dimyan
(74) *Attorney, Agent, or Firm*—Staas & Halsey LLP

(57) ABSTRACT

A board design aiding apparatus that simplifies a designed printed wiring board to predict a displacement quantity of the printed wiring board includes a layer thickness calculation section 21 for obtaining a mean thickness of an area of a board by a prescribed rule for an essential material forming a layer at each layer for constructing the printed wiring board, and a laminate model forming section 22 for forming a simple laminate model by laminating layers having layer thickness calculated by the layer thickness calculation section 21.

15 Claims, 15 Drawing Sheets

DISPLACEMENT QUANTITY

LOW DENSITY

\* INSULATING LAYER THICKNESS DIRECTLY ON WIRING LAYER BECOMES LOW TO BRING ABOUT A DIFFERENCE BETWEEN LOW AND HIGH THICKNESSES

FIG. 16

ORTHOGONAL TABLE (EXAMPLE)

| | L1 THICKNESS | L2 THICKNESS | Ln THICKNESS | THICKNESS BETWEEN L1 AND L2 | THICKNESS BETWEEN Ln AND Lm | DISPLACEMENT QUANTITY |
|---|---|---|---|---|---|---|
| 1 | 0.020 | 0.020 | 0.020 | 0.050 | 0.040 | 0.0358 |
| 2 | 0.020 | 0.015 | 0.020 | 0.050 | 0.040 | 0.0521 |
| 3 | 0.020 | 0.010 | 0.020 | 0.040 | 0.035 | 0.0354 |
| . | . | . | . | . | . | . |
| . | . | . | . | . | . | . |
| . | . | . | . | . | . | . |

BOARD DESIGN AIDING APPARATUS, BOARD DESIGN AIDING METHOD AND BOARD DESIGN AIDING PROGRAM

BACKGROUND OF THE INVENTION

1. Field of the Invention

The present invention relates to a board design aiding apparatus which forms a simple laminate model by simplifying a designed board and calculates a thermal displacement of a board on the basis of the simple laminate model, a board design aiding method and a board design aiding program.

2. Description of Related Art

Heretofore, a wiring pattern design in a printed wiring board uses an automatic tool and the like on the basis of a design rule (a width, a thickness, an interval and the like of a wiring) and is manufactured without considering conditions of a material selection, a manufacturing process and the like. Therefore, a deflection (displacement quantity) and the like effected by influence of a temperature change in a temperature processing step might be sometimes increased after the printed wiring board has completed. In such a case, it is repeated to again manufacture the printed wiring board by altering the design.

As a conventional technique which can determine a position of a reinforcing section of a printed wiring board by a simple and more rational method, a technique is known comprising a step of embedding a dummy material lowered in rigidity in a groove section of a multi-surface printed board as compared with its peripheral portion, a step of obtaining a stress or deformation quality distribution of the groove section by performing a deforming simulation to the multi-surface printed board embedding a dummy material, and a step of specifying a high stress portion or a high deformation quantity portion in the groove section on the basis of the obtained stress or deformation quantity distribution (e.g., Patent Document 1: Japanese Patent Laid-Open Publication No. 10-93206).

However, since a problem becomes clear after a printed wiring board has been manufactured in the above-mentioned conventional technique, a repetition of a cycle of designing and manufacturing the printed wiring board has been increased to prolong a developing period and to increase its cost. If a problem considered in advance in the case that a displacement quantity is increased is intended to be predicted by using a three-dimensional analysis and the like, a huge number of factors have been brought about and, therefore, its prediction become very difficult.

Even in the above-mentioned patent reference I, the problem of predicting the displacement quantity according to a temperature of such a complicated printed wiring board cannot be solved.

SUMMARY OF THE INVENTION

The present invention has been made to solve the above-mentioned conventional problems and has an object to provide a board design aiding apparatus, a board design aiding method and a board design aiding program which are capable of easily and inexpensively predicting a displacement quantity of a printed wiring board according to its temperature change.

To solve the above-mentioned problems, the present invention provides a board design aiding apparatus which simplifies a designed printed wiring board to predict a displacement quantity of the printed wiring board, comprising a layer thickness calculation section that obtains a mean thickness of an essential material forming a layer at each layer constructing a printed wiring board with respect to an area of the board, and a laminate model forming section that forms a simple laminate model by laminating the layers each having a layer thickness calculated by the layer thickness calculation section.

Here, the layer thickness calculation section is characterized by obtaining a mean thickness of a first layer by including a volume of the same material as the essential material of the first layer in the second layer in a volume of an essential material of the first layer when the same material as the essential material of the first layer is included in the second layer adjacent to the first layer.

The layer thickness calculation section is characterized by obtaining a mean thickness of a third layer without including a volume of the same material as the essential material of the third layer in the fourth layer in a volume of an essential material when the same material as the essential material of the third layer is included in the fourth layer adjacent to the third layer.

Further, the board design aiding apparatus of the present invention comprises a displacement quantity calculation section that calculates a displacement quantity generated upon changing of a process temperature on the basis of physical property information forming each layer about a laminate model formed by the laminate model forming section.

Here, the laminate model forming section is characterized by altering a simple laminate model on the basis of a calculation result of the displacement quantity calculation section.

A concavo-convex information acquisition section is characterized by acquiring concavo-convex information about the printed wiring board by using a manufacturing line trend value obtained by quantifying a trend of generating a result different from the design value by a manufacturing process of the printed wiring board for a design value relating to the printed wiring board.

The present invention provides a board design aiding method which simplifies a designed printed wiring board to predict a displacement quantity of the printed wiring board, comprising a layer thickness calculation step of obtaining a mean thickness of an essential material forming a layer at each layer constructing a printed wiring board with respect to an area of the board, and a laminate model forming step of forming a simple laminate model by laminating the layers each having a layer thickness calculated by the layer thickness calculation step.

Here, the layer thickness calculation step is characterized by obtaining a mean thickness of a first layer by including a volume of the same material as the essential material of the first layer in the second layer in a volume of an essential material of the first layer when the same material as the essential material of the first layer is included in the second layer adjacent to the first layer.

Further, the board design aiding method of the present invention comprises a displacement quantity calculation step of calculating a displacement quantity generated upon changing of a process temperature on the basis of physical property information forming each layer about a laminate model formed by the laminate model forming step.

The board design aiding method of the present invention may include a simple laminate model altering step of altering a data about simple laminate model on the basis of a calculation result of the displacement quantity calculation step.

Here, the concavo-convex information acquisition step is characterized by acquiring the concavo-convex information about the printed wiring board by using a manufacturing line trend value obtained by quantifying a trend of generating a result different from the design value by a manufacturing process of the printed wiring board for a design value relating to the printed wiring board.

The present invention provides a board design aiding program which simplifies a designed printed wiring board to predict a displacement quantity of the printed wiring board, for causing a computer to execute a layer thickness calculation step of obtaining a mean thickness of an essential material forming a layer at each layer constructing a printed wiring board with respect to an area of the board, and a laminate model forming step of forming a simple laminate model by laminating the layers each having a layer thickness calculated by the layer thickness calculation step.

According to the present invention, the displacement quantity of the printed wiring board having complicated shape and structure according to a temperature change can easily and inexpensively predicted.

BRIEF DESCRIPTION OF THE DRAWINGS

FIG. 16 is a diagram showing an orthogonal table.

DETAILED DESCRIPTION OF THE PREFERRED EMBODIMENTS

In the following, embodiments of the present invention will be described in detail with reference to the accompanying drawings.

First Embodiment

Figure 1:
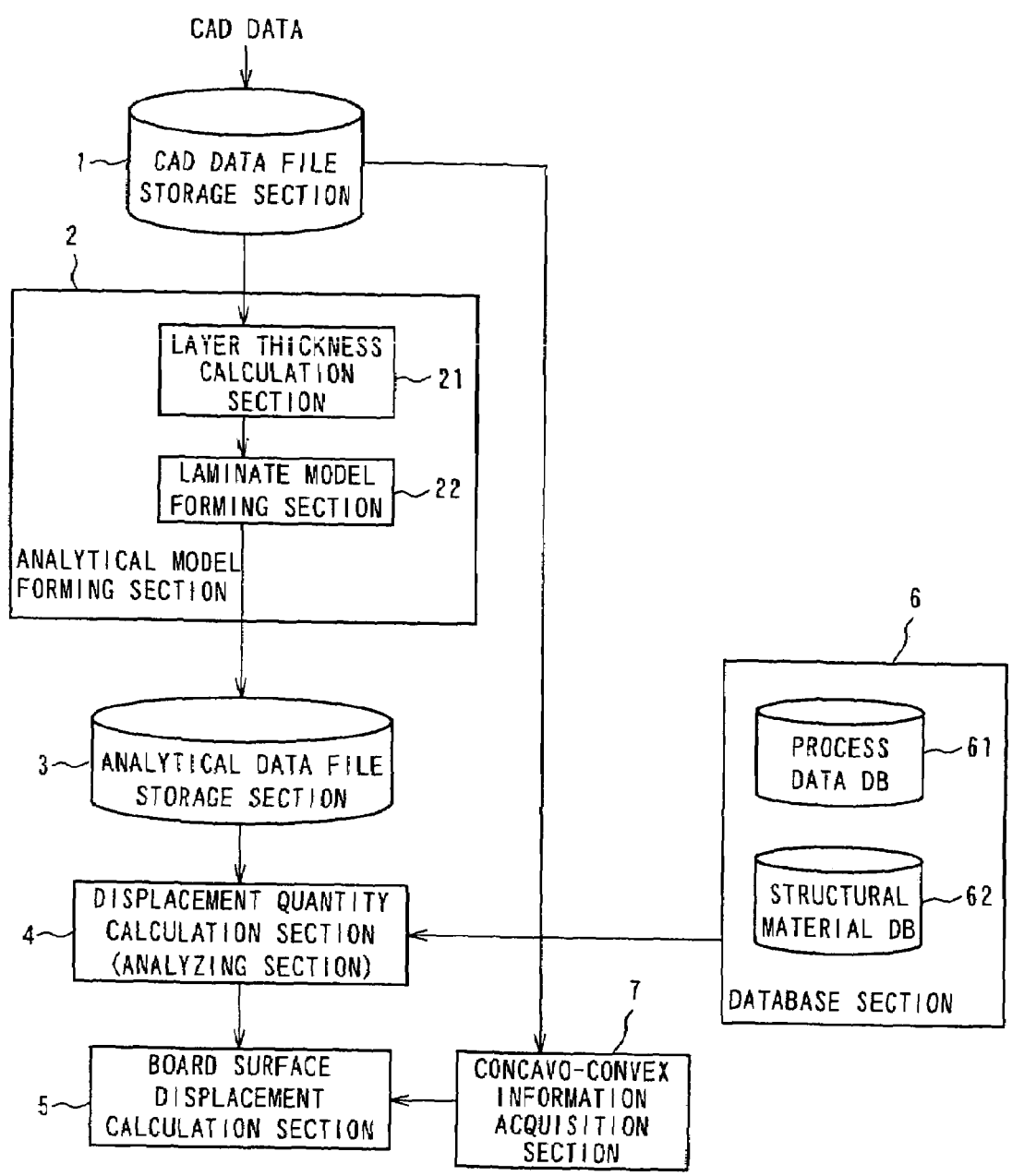
FIG. 1 is a block diagram showing a structure of a first embodiment of the present invention.

FIG. 1 is a block diagram showing a board design aiding apparatus in a first embodiment of the present invention. This board design aiding apparatus comprises a CAD data file storage section 1 for storing a CAD data, with which a printed wiring board is designed, an analytical model forming section 2 for forming an analytical model by shape converting using the CAD data file stored in the CAD data file storage section 1, an analytical data file storage section 3 for storing temporarily the analytical model formed by the analytical model forming section 2, an analyzing section (displacement quantity calculation section) 4 for calculating a displacement quantity generated by a temperature process by using the analytical data file stored in the analytical data file storage section 3, a board surface displacement calculation section 5 for calculating a displacement quantity of a board surface on the basis of the displacement quantity calculated by the displacement quantity calculation section 4, a database section 6 for supplying necessary data used for its analysis, and a concavo-convex information acquisition section 7 for acquiring concavo-convex information used in the board surface displacement calculation section 5 from the CAD data file storage section 1.

In the above-mentioned structure, the analytical model forming section 2 comprises a layer thickness calculation section 21 for obtaining a layer thickness for each layer in a plurality of layers for constructing the printed wiring board on the basis of the CAD data file and a laminate model forming section 22 for forming an analytical simple laminate model by laminating layers having calculated layer thickness.

The database (DB) section 6 comprises a process data DB 61 for storing a processing temperature and the like in a manufacturing process, and a structural material DB 62 for storing physical property information necessary to calculate a temperature displacement, such as, for example, a thermal expansion coefficient, a Young's modulus and the like as physical property information relating to an essential material for constructing the respective layers of the printed wiring board, that is, the materials of the respective layers formed by the laminate model forming section 22.

The concavo-convex information acquisition section 7 acquires the concavo-convex information, as will be described later from the CAD data file storage section 1.

An operation of the first embodiment according to the present invention will be described.

Figure 2:
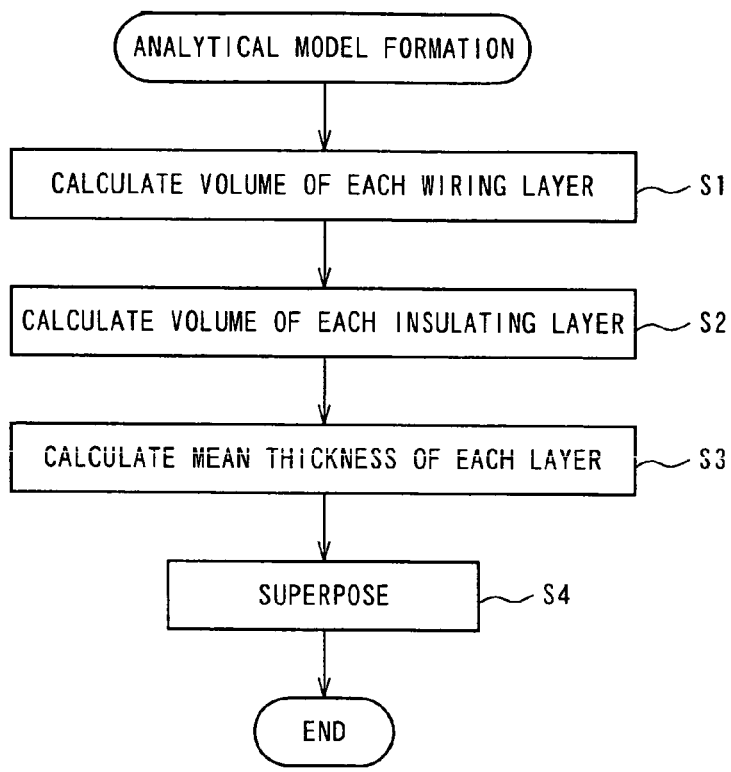
FIG. 2 is a flow chart showing a model (simple laminate model) forming operation for an analysis in the first embodiment of the present invention.
Figure 3:
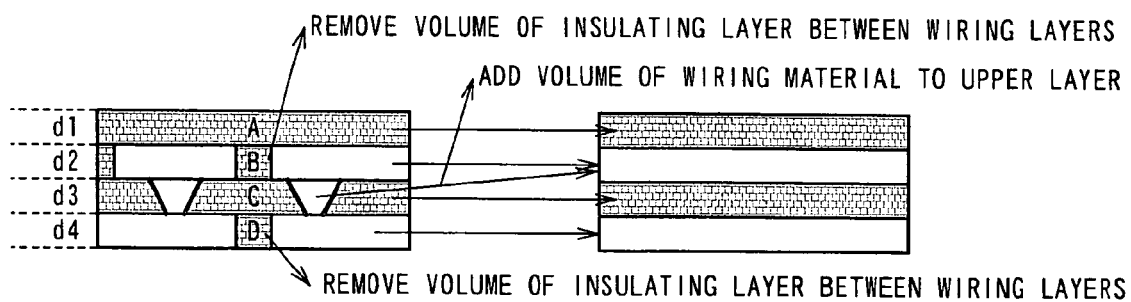
FIG. 3 is a diagram for explaining a rule used when a simple laminate model is formed.

FIG. 2 is a flow chart showing an analytical model forming operation in the analytical model forming section 2. First, a volume of an essential material for constructing a layer is calculated for each layer for constructing a printed wiring board according to a predetermined rule with printed wiring bard data obtained from the CAD data file storage section 1 (steps S1 and S2). For example, as shown in FIG. 3, if the printed wiring board includes, from the lowermost layer, a wiring layer (d4), an insulating layer (d3), a wiring layer (d2) and an insulating layer (d1), the volumes of the respective wiring layers are calculated (step S1), and then the volumes of the respective insulating layers are calculated (step S2).

In an operation of step S1, as a first rule, if an amount of an insulating material different from a wiring material of an essential material is included in the wiring layer (for example, d2: corresponding to the first layer of the present invention), the volume of the amount of the insulating material in its wiring layer is ignored. If the same wiring material as the wiring layer is included through a via and the like in the insulating layer (d3: corresponding to the second layer of the present invention) adjacent to (to be superposed at a lower side) the wiring layer, the volume of the wiring material is added to that of the essential material of the wiring layer (d2), and the volume of the wiring layer (d3) is calculated.

In an operation of the step S2, as a second rule, if a wiring material exists in the insulating layer (d3: corresponding to the third layer of the present invention) through a via and the like, the volume of the wiring material is ignored (included in the volume of the wiring layer of its upper layer side). Also, even if the same insulating material as the insulating layer is included in the wiring layer (d4: corresponding to the fourth layer of the present invention) (to be superposed at the lower side) adjacent to the insulating layer, the volume of the insulating material is not added to the insulating layer (d3) like the first rule 1, and the volume of the insulating layer is calculated.

In this manner, when the volume of each layer is calculated, a mean thickness of each layer is then calculated (step S3). This calculation is executed by dividing the volume of each layer by the area of the board. When the mean thickness of each layer is calculated, a simple laminate model (analytical model) obtained by superposing and simplifying the respective layers each having its mean thickness is formed (step S4).

Figure 4A:
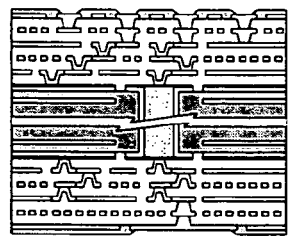
FIGS. 4(A)–4(D) are diagrams conceptually showing the formations of concrete models for analysis.
Figure 4B:
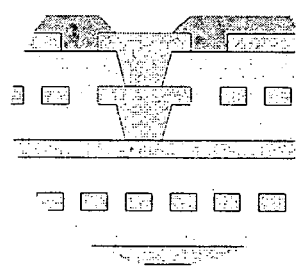
Figure 4C:
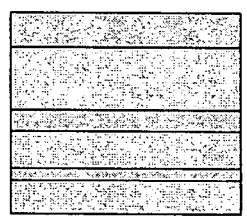
Figure 4D:
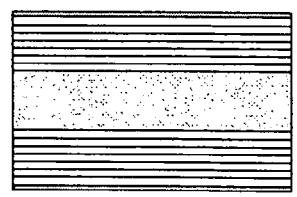

FIG. 3 shows a simple example for the convenience of explaining an analytical model formation. As shown in FIG. 4, a printed wiring board having more complicated structure is similarly applied. In FIG. 4, FIG. 4A shows a sectional structure of a printed wiring board, FIG. 4B shows a detailed sectional structure of a portion of the sectional structure of the printed wiring board, FIG. 4C shows the case that the structure of the portion shown in FIG. 4B is simplified by the same process as that shown in FIGS. 2 and 3, and FIG. 4D shows the case that the structure of the entirety of FIG. 4A is simplified by the same process as that shown in FIGS. 2 and 3. That is, FIG. 4D shows a simple laminate model (analytical model) formed from the printed wiring board of FIG. 4A.

In this manner, the analytical model forming section 2 obtains a mean thickness of an essential material (for example, a wiring material and an insulating material) for constructing its layer at each layer for constructing its printed wiring board from the printed wiring board having a complicated structure with respect to the area of the board according to predetermined rules (first and second rules), and forms a simple laminate model by laminating the layers of the obtained layer thickness.

Figure 5:
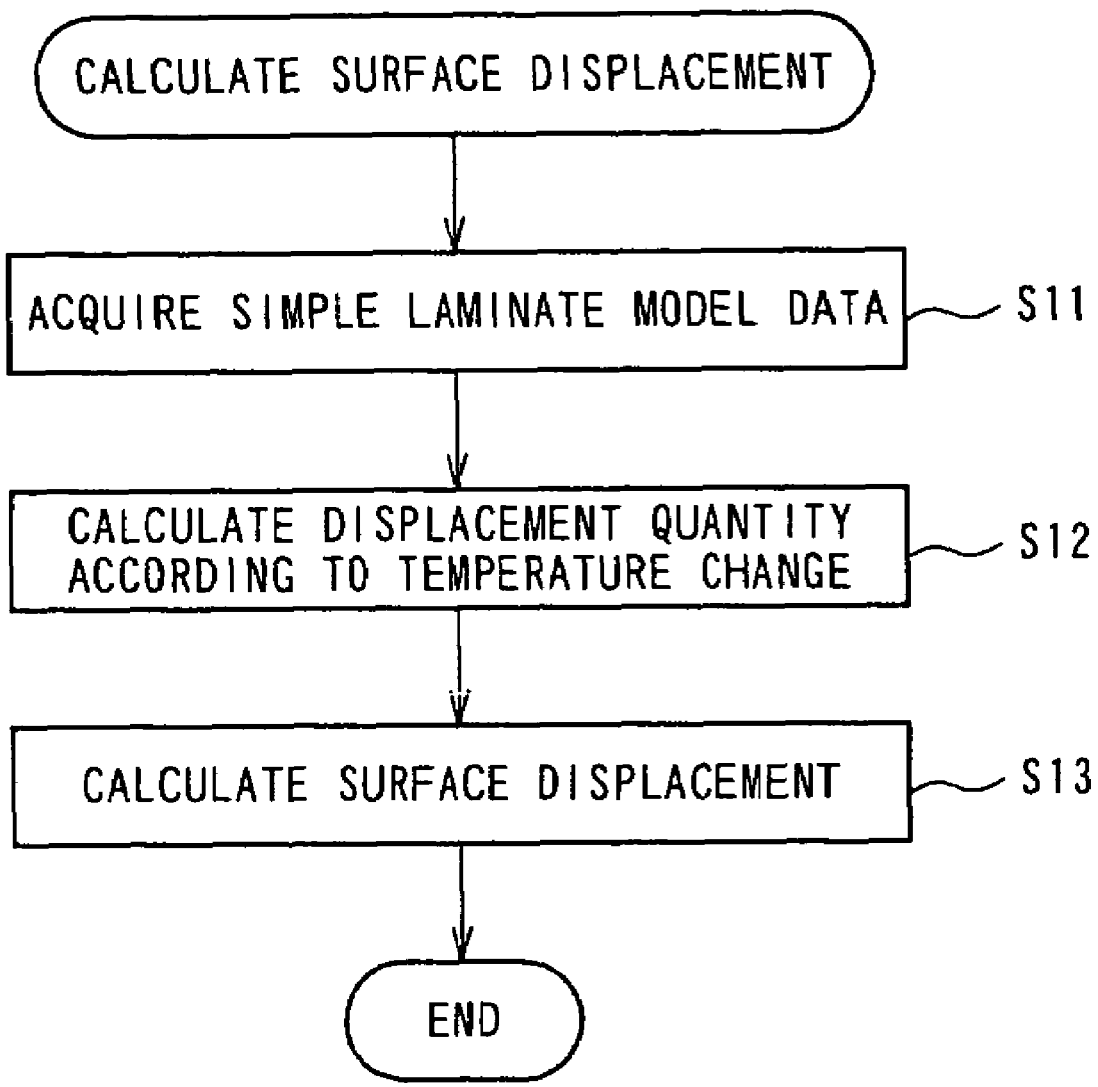
FIG. 5 is a flow chart showing a surface displacement calculation processing operation.

Next, a surface displacement calculating operation for calculating a surface displacement of a printed wiring board will be described by using the formed simple laminate model by referring to a flow chart of FIG. 5.

Figure 6A:
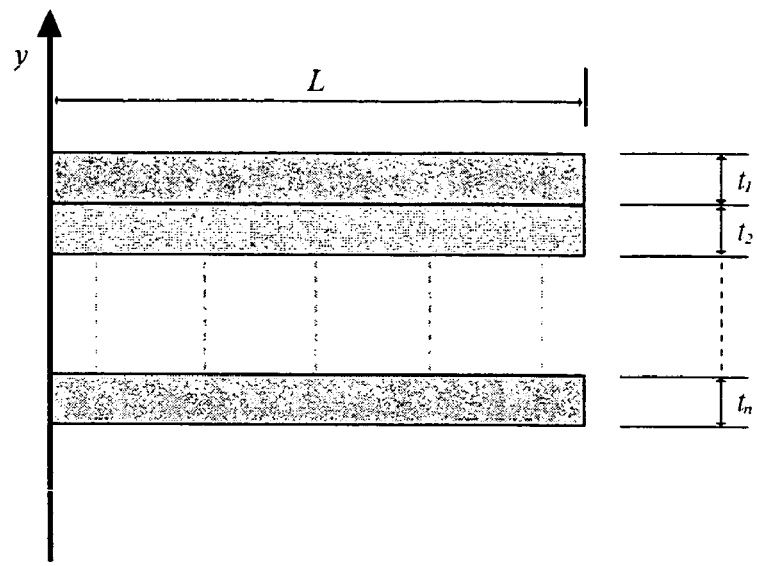
FIGS. 6(A)–6(B) are schematic views showing thermal deformations of multilayer structures.
Figure 6B:
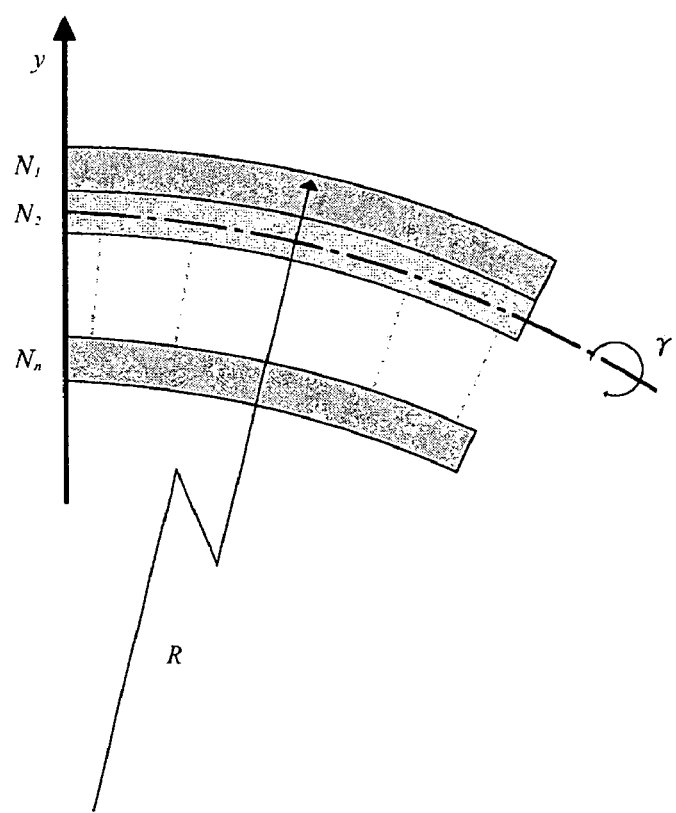

First, a displacement quantity calculation section 4 acquires a simple laminate model data from an analytical data file storage section (step S11), and calculates the displacement quantity of a process temperature changing part (step S12). The displacement quantity is a displacement quantity brought about as shown in FIG. 6B from the same or difference of its thermal expansion coefficient and Young's modulus when the simple laminate model as shown in FIG. 6A receives a temperature change. The thermal expansion coefficient and the Young's modulus are acquired from a constructional material DB 62, and a process temperature change is acquired from a process data DB 61.

This calculating method is well known, and, therefore, its explanation here will be omitted. However, as one example, a calculation formula of a warp due to a difference of a thermal expansion coefficient of a multilayer laminate board disclosed in an evaluation of a stress/deformation of a printed board according to a mechanical multilayer beam theory in a collection of theses of Japan society of mechanical engineers, Vol. 59, No. 563, 1993-7 (by Oda Juhachi et al) can be used.

In this manner, when a displacement quantity at a temperature change is calculated, the board surface displacement calculation section 5, then, adds or subtracts a concavo-convex quantity on the surface of the printed wiring board which can be obtained from the design data of the CAD data file storage section 1 by the concavo-convex information acquisition section 7 to or from the displacement quantity obtained by the displacement quantity calculation section 4 to obtain the displacement quantity of the surface of the printed wiring board (step S13).

Figure 7A:
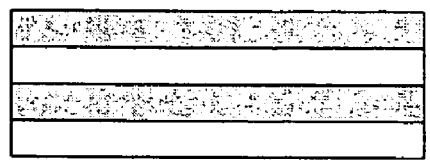
FIGS. 7(A)–7(C) views for explaining the concept of a surface displacement calculation.
Figure 7B:
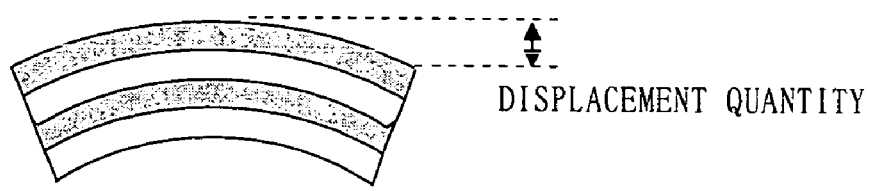
Figure 7C:
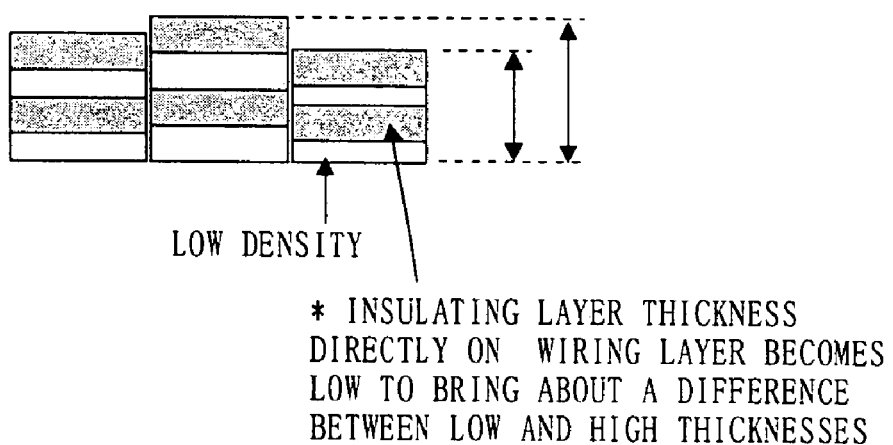

It should be noted that this concavo-convex is brought about due to the difference of the thickness of the wiring layer in an inward direction in the surface of the board. In a region having a thin wiring layer, a concave portion is easily formed as compared with a region having a thick wiring layer (the region having the thick wiring layer is easily formed with a convex portion as compared with a region having a thin wiring layer). Therefore, as shown, for example, in FIG. 7A, in the board having the wiring layer of a constant thickness, the respective portions on the surface of the board are exposed in the displacement quantity obtained as shown in FIG. 7B, by the simple laminate model. However, in a region having, for example, a thin wiring layer as shown in FIG. 7C, a concave portion is formed on the surface, and it is preferable that its displacement is obtained by adding a depth of its concave portion to the displacement quantity calculated in the step S12.

Figure 8:
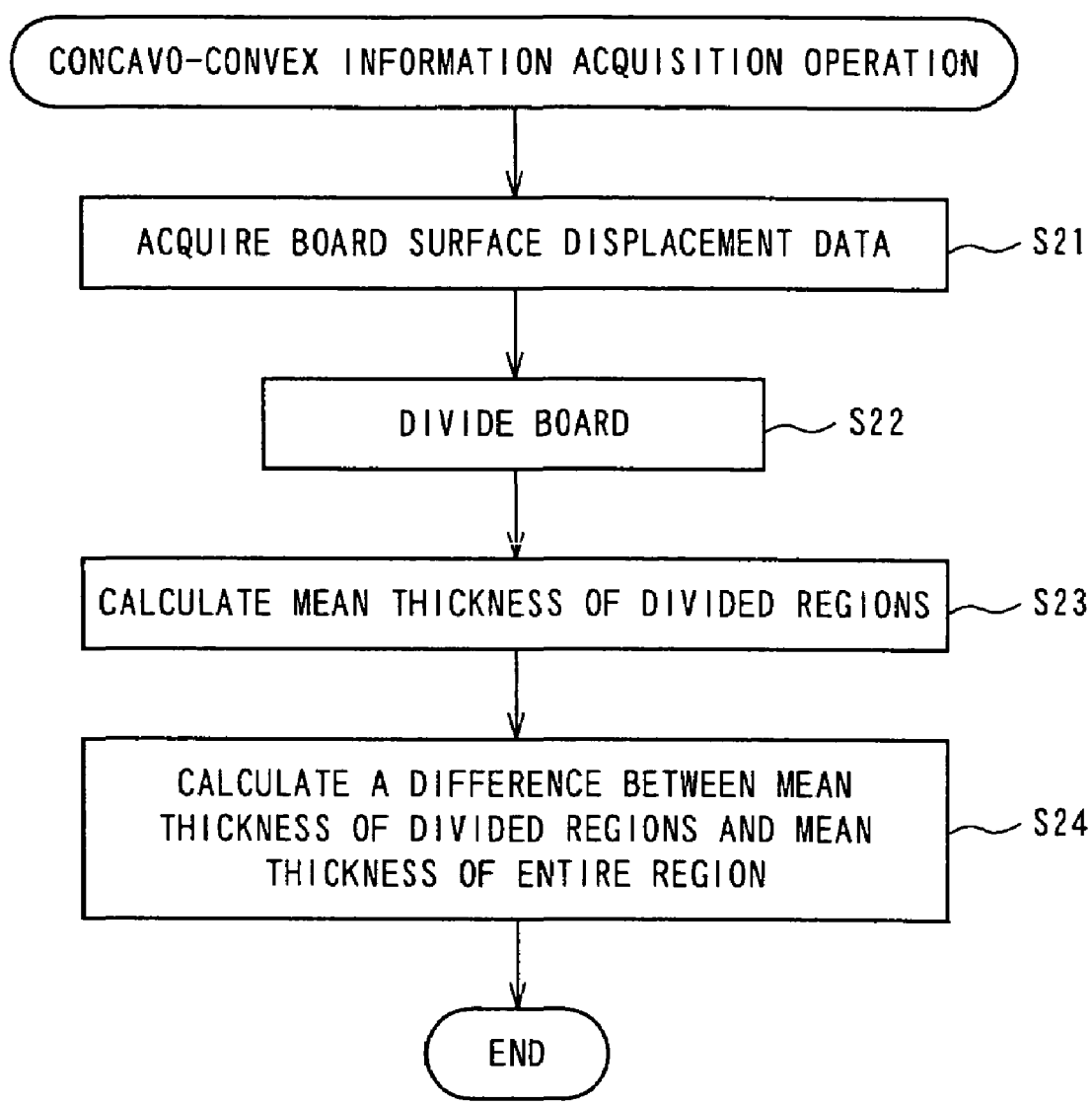
FIG. 8 is a flow chart showing an acquisition operation of convexo-concave information.

FIG. 8 is a flow chart showing a concavo-convex information acquisition operation by the concavo-convex information acquisition section 7. First, board surface displacement data at a designing time is acquired from a CAD data file (step S21). Then, the concavo-convex information acquisition section 7 divides the board by a predetermined shape (step S22), and calculates the mean thickness of the board in each of the divided respective regions (step S23). Then, a difference between the mean thickness of the board in the respective divided regions and the mean value of the thickness of the board in the entire region of the board is obtained (step S24). In a surface displacement calculation shown in FIG. 5 (step S13), the difference of the thicknesses obtained in step S24 is added to the displacement quantity in each region acquired in step S12 to obtain the surface displacement of the board. Incidentally, one example of the method for calculating the surface displacement by considering the concavo-convex has been explained here. However, it should be noted that the present invention may adopt a method except the above-mentioned method for adopting the mean thickness of the board as a reference, such as, a method for adopting the minimum thickness of the board as a reference, a method for adopting the maximum thickness of the board as a reference and the like without departing from the scope of the present invention.

Figure 9A:
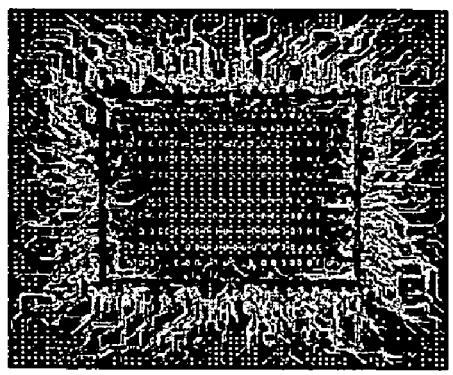
FIGS. 9(A)–9(B) are schematic views showing No. 1 of a board dividing method.
Figure 9B:
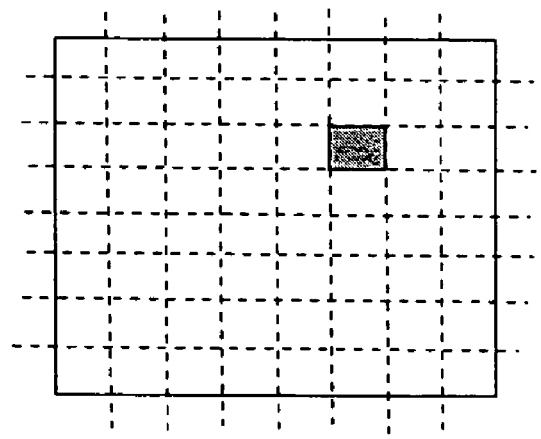

FIG. 9 through 11 shows a method for dividing a printed wiring board. A first method for dividing the printed wiring board is a method for dividing the portions of the printed wiring board as shown in FIG. 9A in a lattice state as shown in FIG. 9B. In this case, since the region is finely divided, this method has an excellent accuracy, but takes a labor hour, which deteriorates the efficiency of processing.

Figure 10A:
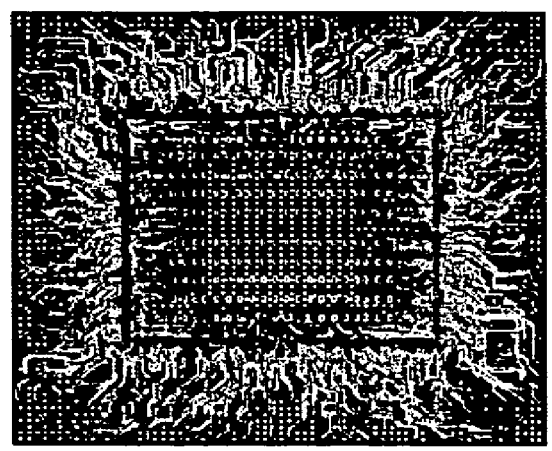
FIGS. 10(A)–10(B) are schematic views showing No. 2 of a board dividing method.
Figure 10B:
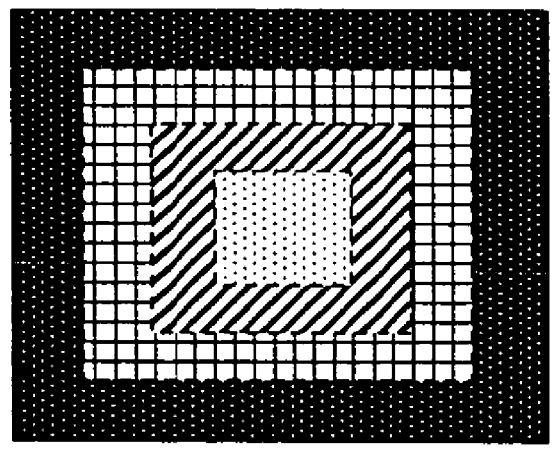

Consequently, as a second method for dividing a printed wiring board, in such a case like vertically and horizontally symmetrical designs as shown in FIG. 10A, there is a method for dividing respective portions into concentric frame state like FIG. 10B is adopted. In this case, since it is not necessary to finely divide the portions as shown in FIG. 9B, the efficiency of processing becomes excellent.

Figure 11A:
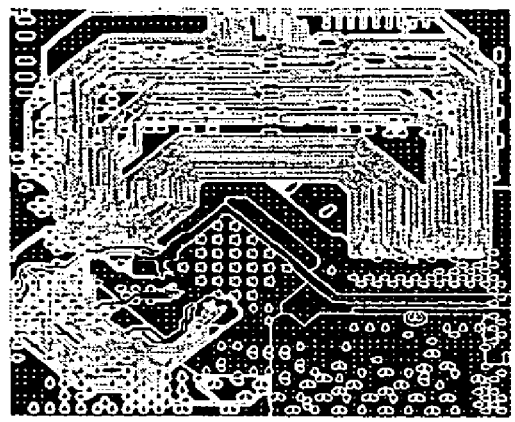
FIGS. 11(A)–11(B) are schematic views showing No. 3 of a board dividing method.
Figure 11B:
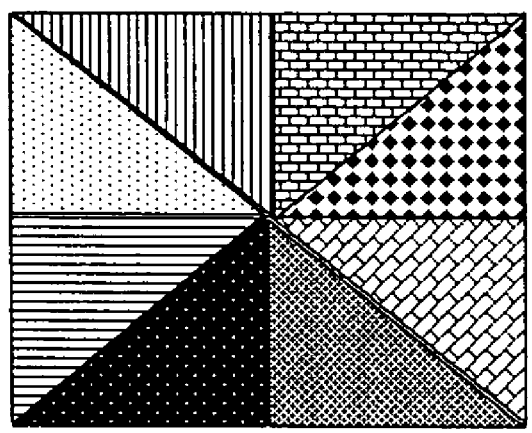

As a third method for dividing a printed wiring board, in such a case like vertically and horizontally asymmetrical designs as shown in FIG. 11A, the respective portions may be divided radially as shown in FIG. 11B. In this manner, the processing method having excellent accuracy and efficiency can be obtained by suitably selecting the dividing method for dividing the printed wiring board depending on its design.

According to the first embodiment, since the simple laminate model is formed from the printed wiring board having a complicated sectional structure, a temperature displacement is obtained on the basis of the simple laminate model and the concavo-convex of the surface is included in the displacement, the temperature displacement of the printed wiring board can be simply and accurately obtained.

Second Embodiment

The first embodiment has obtained the concavo-convex on the surface of the printed wiring board on the basis of only design value data. However, there might sometimes occur a result different from the design value tendentiously for the design value about the printed wiring board by routing a manufacturing process. Therefore, the second embodiment will be described with reference to the trend occurring in the thickness of the wiring layer as an example.

Figure 12:
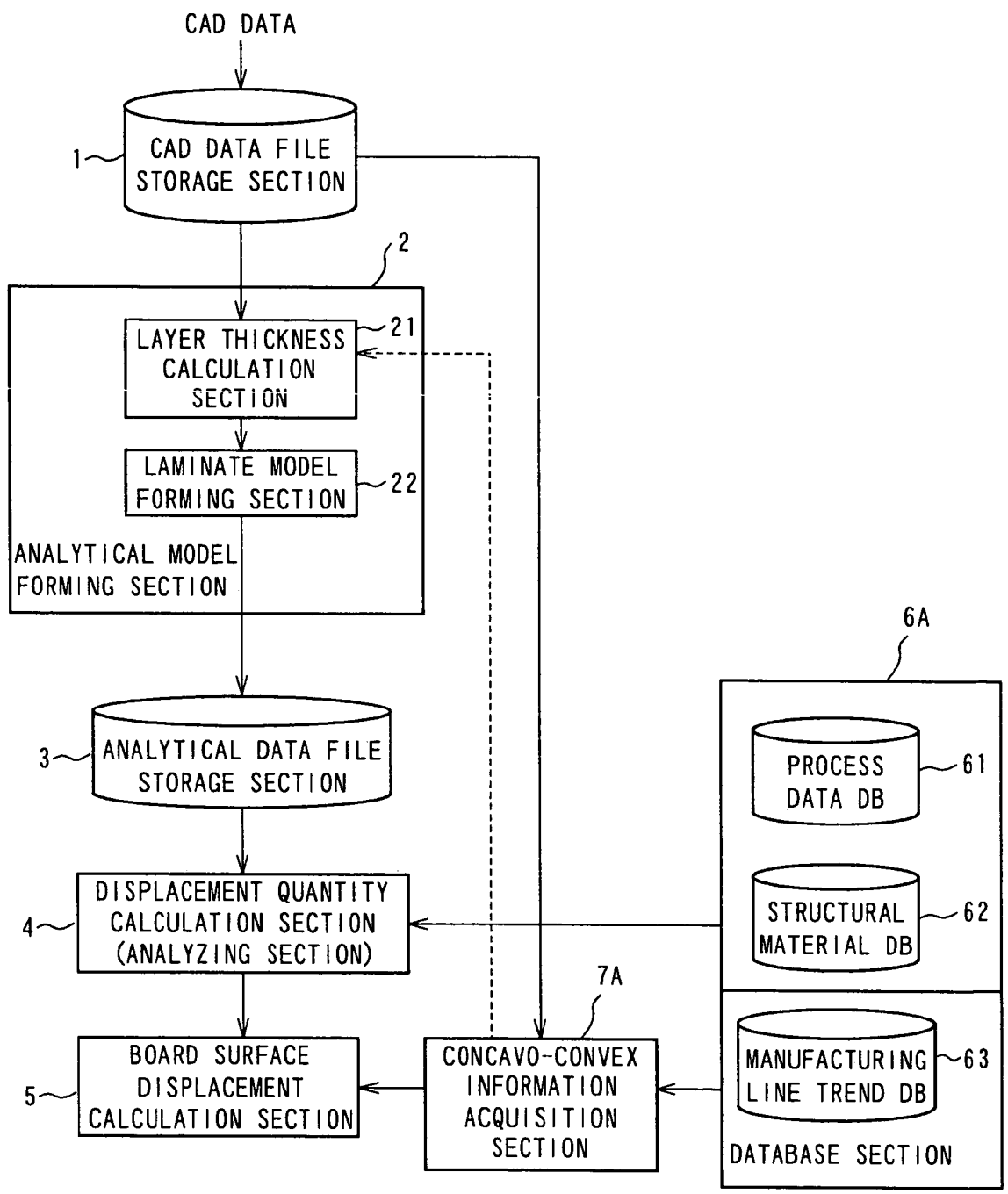
FIG. 12 is a block diagram showing a structure of a second embodiment.

FIG. 12 shows a block diagram of a board design aiding apparatus according to the second embodiment.

Generally, a wiring layer is formed in a step of plating a printed wiring board. In this case, the printed wiring board is formed thicker or thinner than the design value according to a plating place. Therefore, a database section 6A in the second embodiment includes a manufacturing line trend DB 63 which acquires such a trend statistically and quantitatively and stores such a trend as a manufacturing line trend value.

A concavo-convex information acquisition section 7A acquires concavo-convex information from a CAD data file storage section 1 and the manufacturing line trend DB 63. For example, when the thickness of the wiring layer is obtained as T on the basis of a design value, data for correcting the thickness T is acquired as the manufacturing line trend value at a place for plating the wiring layer from the manufacturing line trend DB 63. For example, if the manufacturing line trend value is +a, concavo-convex information acquisition section 7A replaces T×(1+a) as its designed wiring layer thickness, and executes the similar process to that in the first embodiment by using it.

Incidentally, in the second embodiment, the manufacturing line trend value obtained by this concavo-convex information acquisition section 7A has been used only in the board surface displacement calculation section 5. However, it is noted that the simple laminate model by the corrected layer thickness may be formed by using this manufacturing line trend value for the layer thickness calculation section 21 as shown by a dotted line in FIG. 12.

In this manner, according to the second embodiment, the trend value in the manufacturing process can be adopted for the surface displacement of the printed wiring board, and its accuracy can be raised. Incidentally, in FIG. 12, the same reference numerals as those shown in FIG. 1 designate the same as or equivalent to the parts and corresponding parts in FIG. 1, and accordingly the description thereof will be omitted.

Third Embodiment

Figure 13:
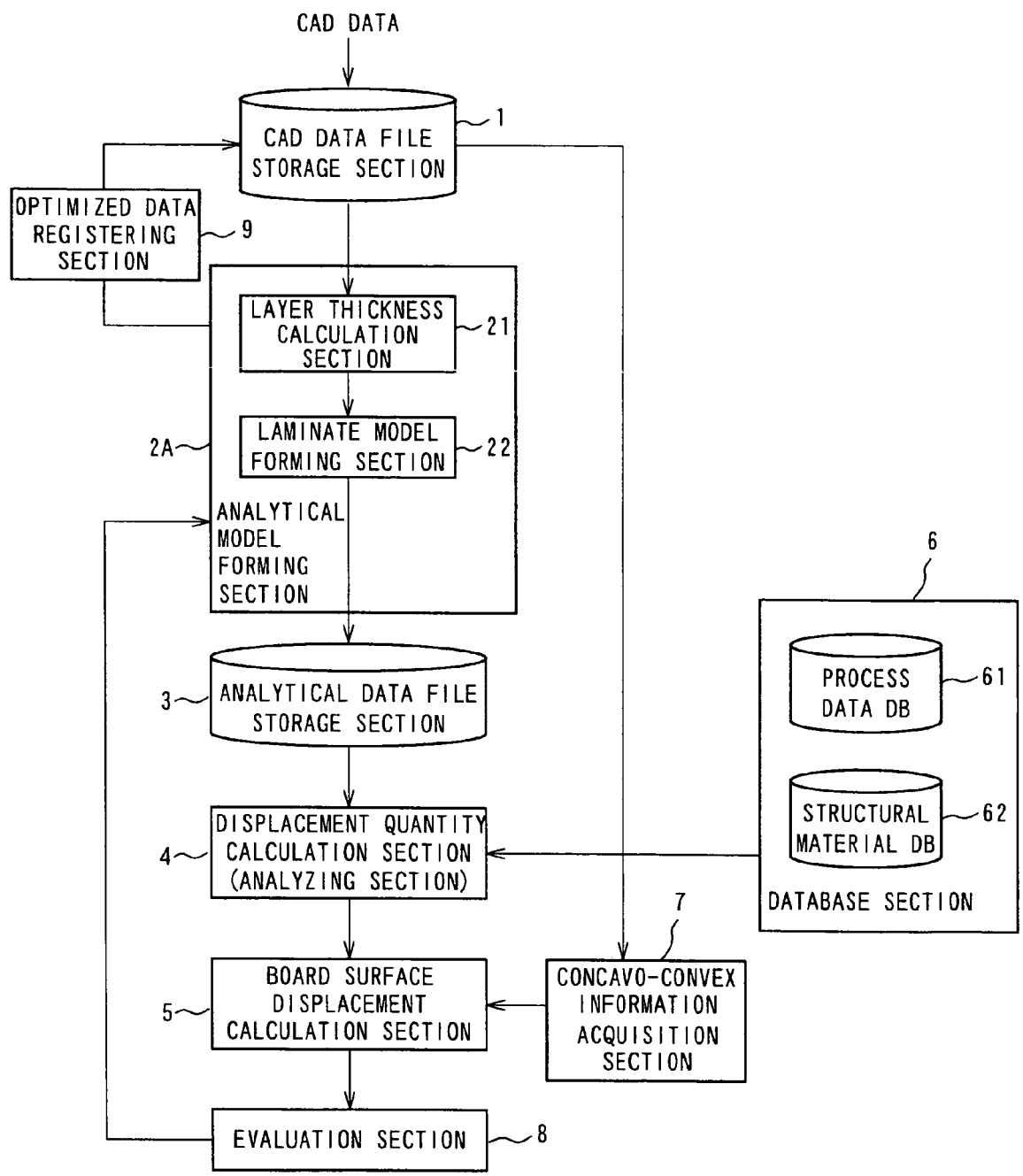
FIG. 13 is a block diagram showing a structure of a third embodiment.

FIG. 13 is a block diagram showing a structure of a third embodiment. The third embodiment includes an evaluation section 8 in the structure of the first embodiment, and also includes an optimized data registering section 9. The third embodiment will be described with respect to the case that an analytical model formation and a displacement quantity calculation are repeated while an initial pattern (initial design value (initial data)) is changed to evaluate the analytical model formation and the displacement quantity calculation and to optimize the printed wiring board design.

Figure 14:
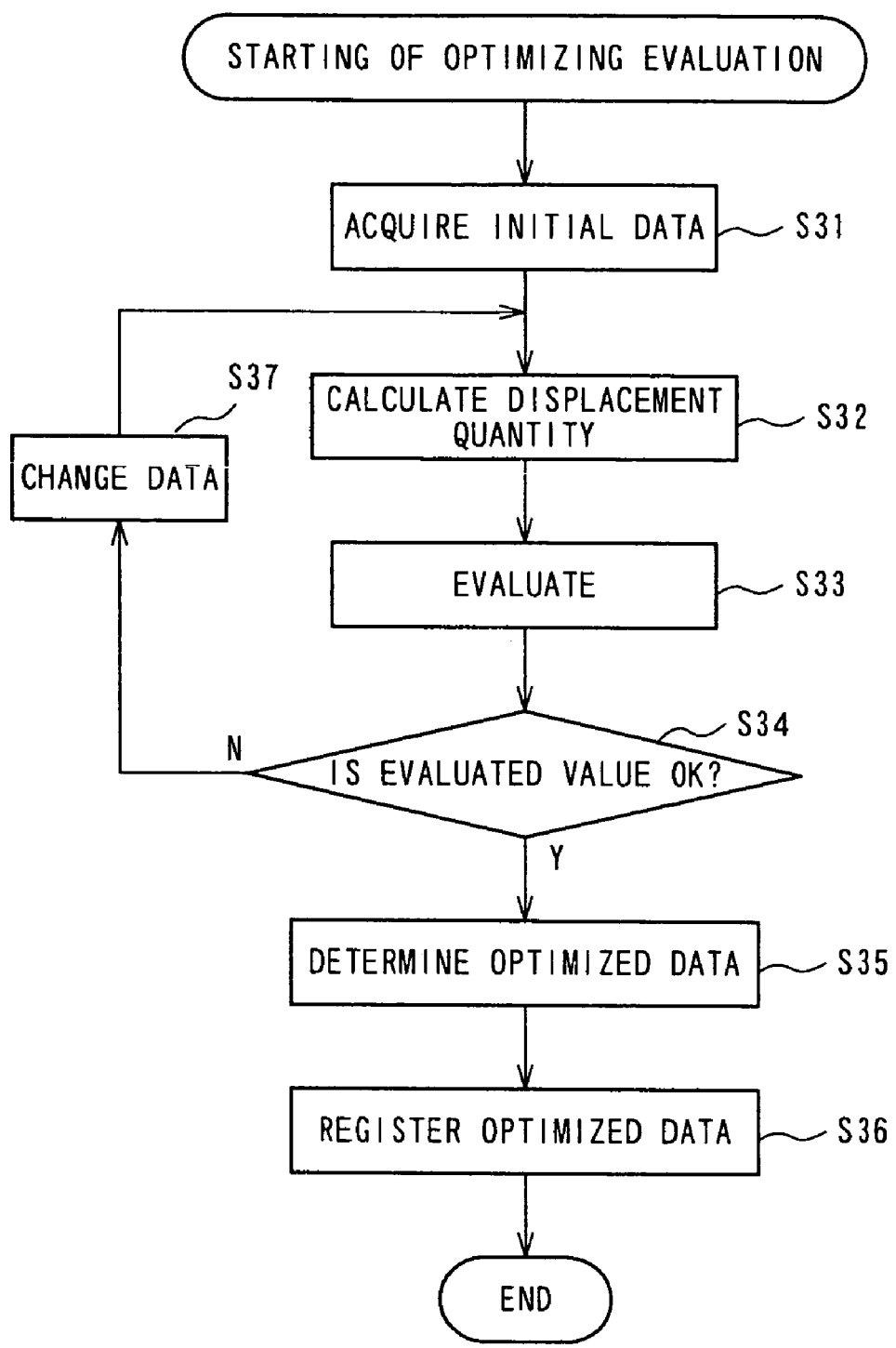
FIG. 14 is a flow chart showing an operation of a third embodiment.

FIG. 14 is a flow chart showing an operation of the third embodiment.

Figure 15A:
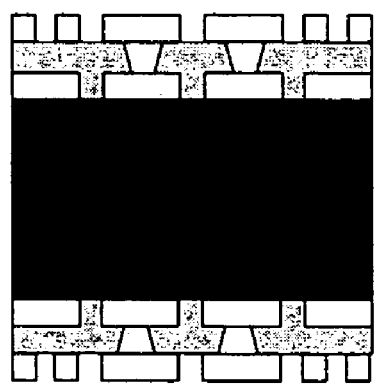
FIGS. 15(A)–15(B) are views showing sectional structures of a printed wiring board for explaining an optimizing process.
Figure 15B:
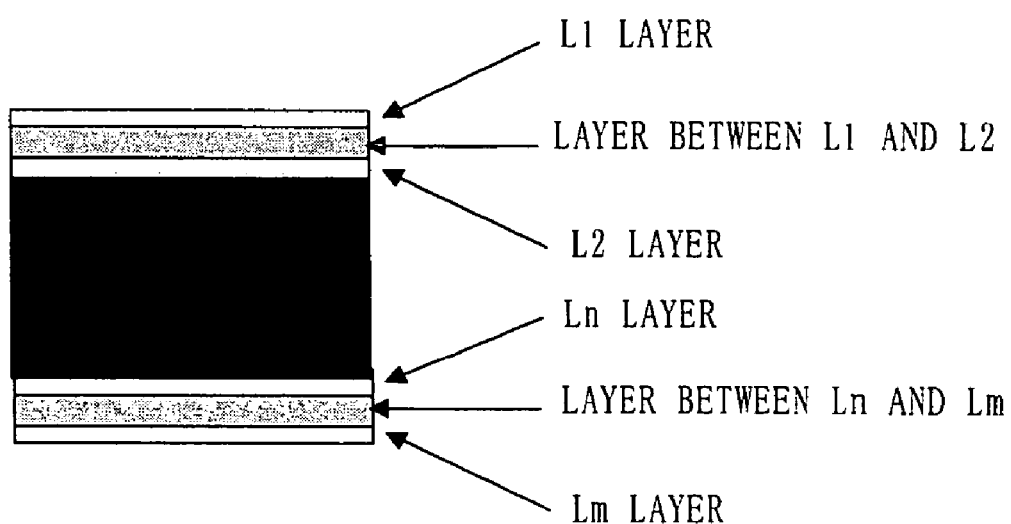

Here, a laminate model is formed up to L1 to Lm layers as shown in FIG. 15B for the initial printed wiring board (initial design value) of FIG. 15A, and initial data is acquired (step S31).

Then, a combination (first data) of first data is obtained for the thickness L1 to Lm of the respective layers (wiring layers) and the thicknesses L1–L2 and Ln–Lm of the respective layers (insulating layers) shown in the orthogonal table of FIG. 16. This first data which are obtained by using prescribed design data themselves (design value in the initial pattern) are preferably used.

A displacement quantity calculation section 4 executes a displacement quantity calculation process for the data of formed first combination (step S32), and an evaluation section 8 evaluates its result (step S33). If the evaluation result does not satisfy optimum conditions (if a displacement quantity or a surface displacement quantity does not, for example, falls within a predetermined value) (N in step S34), the evaluation section 8 designates to execute a similar process for the values of next combination, an analytical model forming section 2A changes the first data (step S37), and the similar process is executed in the following. In this case, the analytical model forming section (laminate model forming section 22) 2A constructs an initial pattern changing section of the present invention. Incidentally, the displacement quantity obtained at this time is described in a column of a displacement quantity in the orthogonal table of FIG. 16. The evaluation reference of the evaluation section 8 uses a reference in which the displacement quantity becomes, for example, a predetermined value or less.

If the evaluation result by the evaluation section 8 satisfies the optimum conditions (Y in step S34), optimum data is determined by the evaluation result (step S35), an optimized data registering section 9 registers the data as the optimized data with the CAD data file storage section 1 (step S36), and ends the optimizing process.

Incidentally, since the optimum data is obtained as data for displaying the respective thicknesses of FIG. 16, the design values of the respective sections of the initial pattern shown in FIG. 15A can be deformed by using the optimum data. In this case, for one example, the thicknesses of the respective layers shown in FIG. 15A are changed and corrected on the basis of the obtained optimum data. The optimized data registering section 9 may register this changed and corrected data with the CAD data file registering section 1.

Incidentally, although description has been made of a case where the afore-mentioned process obtains the displacement quantity while forming the orthogonal table by the analytical model forming section 2A and repeats the evaluation at each time, the present invention is not limited hitherto. For example, as another technique, a displacement quantity is obtained for a combination of all layer thicknesses and thickness between the layers to be executed first to satisfy the orthogonal table shown in FIG. 16, and the optimum pattern may be determined on the basis of the combination of the obtained displacement quantity and the combination of the thicknesses of the respective layers at that time.

About the evaluation reference of this case, a data set in which the displacement quantity is, for example, a predetermined value or less and which becomes the smallest, is selected. Incidentally, in a method for forming a combination of the thicknesses L1 to Lm of the respective layers (wiring layers) and the thicknesses L1–L2 and Ln–Lm between the respective layers (insulating layers), there is one example to obtain combinations of the respective values by increasing or decreasing the respective values at a constant interval in a range from the initial design value to the value of a given ratio. According to a third embodiment, the optimum pattern structure is obtained on the basis of the design value obtained by the CAD data file, and hence the design of the printed wiring board can be considerably easily and inexpensively executed.

Although description has been made of a case where the embodiments of the present invention have been applied to the multilayer made of the wiring layers and the insulating layers, the present invention can be applied to a case where a layer including other than the wiring layer and the insulating layer. According to the present invention, the steps in the above-mentioned flowcharts of FIG. 2, FIG. 5, FIG. 8 and FIG. 14 are provided as the board design aiding program for executing a computer constructing the board design aiding apparatus. The above-mentioned program can be executed in the computer constructing the board design aiding apparatus by storing the recording medium readable by the computer. Here, as the recording medium readable by the above-mentioned computer, a portable type storage medium, such as, a CD-ROM, a flexible disc, a DVD disc, a magneto optical disc, an IC card and the like, a database for holding a computer program or other computer as well as its database, and further a transmission medium on a line are included.

What is claimed is:

1. A board design aiding apparatus which simplifies a designed printed wiring board to predict a displacement quantity of laminated layers of the printed wiring board, comprising:
   a layer thickness calculation section that obtains a mean thickness of an essential material forming a layer at each layer constructing a printed wiring board with respect to an area of the printed wiring board, and
   a laminate model forming section that forms a simple laminate model for predicting a displacement quantity according to its temperature change by laminating layers each having a layer thickness calculated by the layer thickness calculation section.

2. The board design aiding apparatus according to claim 1, wherein the layer thickness calculation section obtains a mean thickness of a first layer by including a volume of the same material as the essential material of the first layer in the second layer in a volume of an essential material of the first layer when the same material as the essential material of the first layer is included in the second layer adjacent to the first layer.

3. The board design aiding apparatus according to claim 1, wherein the layer thickness calculation section obtains a mean thickness of a third layer without including a volume of the same material as the essential material of the third layer in the fourth layer in a volume of an essential material when the same material as the essential material of the third layer is included in the fourth layer adjacent to the third layer.

4. The board design aiding apparatus according to claim 1, further comprising: a displacement quantity calculation section that calculates a displacement quantity generated upon changing of a process temperature on the basis of physical property information forming each layer about a laminate model formed by the laminate model forming section.

5. The board design aiding apparatus according to claim 1, wherein the laminate model forming section alters a simple laminate model on the basis of a calculation result of the displacement quantity calculation section.

6. A board design aiding apparatus which simplifies a designed printed wiring board to predict a displacement quantity of laminated layers of the printed wiring board, comprising:
   a layer thickness calculation section that obtains a mean thickness of an essential material forming a layer at each layer constructing a printed wiring board with respect to an area of the printed wiring board, and
   a laminate model forming section that forms a simple laminate model by laminating layers each having a layer thickness calculated by the layer thickness calculation section,
   wherein a concavo-convex information acquisition section acquires concavo-convex information about the printed wiring board by using a manufacturing line trend value obtained by quantifying a trend of generating a result different from the design value by a manufacturing process of the printed wiring board for a design value relating to the printed wiring board.

7. A board design aiding method of simplifying a designed printed wiring board to predict a displacement quantity of laminated layers of the printed wiring board, comprising:
   a layer thickness calculation step of obtaining a mean thickness of an essential material forming a layer at each layer constructing a printed wiring board with respect to an area of the printed wiring board, and
   a laminate model forming step of forming a simple laminate model for predicting a displacement quantity according to its temperature change by laminating the layers each having a layer thickness calculated by the layer thickness calculation step.

8. The board design aiding method according to claim 7, wherein the layer thickness calculation step obtains a mean thickness of a first layer by including a volume of the same material as the essential material of the first layer in the second layer in a volume of an essential material of the first layer when the same material as the essential material of the first layer is included in the second layer adjacent to the first layer.

9. The board design aiding method according to claim 7, comprising:
   a displacement quantity calculation step of calculating a displacement quantity generated upon changing of a process temperature on the basis of physical property information forming each layer about a laminate model formed by the laminate model forming section.

10. The board design aiding method according to claim 7, comprising:

a simple laminate model altering step of altering data about a simple laminate model on the basis of a calculation result of the displacement quantity calculation step.

11. A board design aiding method of simplifying a designed printed wiring board to predict a displacement quantity of laminated layers of the printed wiring board, comprising:
- a layer thickness calculation step of obtaining a mean thickness of an essential material forming a layer at each layer constructing a printed wiring board with respect to an area of the printed wiring board, and
- a laminate model forming step of forming a simple laminate model by laminating the layers each having a layer thickness calculated by the layer thickness calculation step,
- wherein a concavo-convex information acquisition step acquires concavo-convex information about the printed wiring board by using a manufacturing line trend value obtained by quantifying a trend of generating a result different from the design value by a manufacturing process of the printed wiring board for a design value relating to the printed wiring board.

12. A board design aiding program stored on a computer-readable medium which simplifies a designed printed wiring board to predict a displacement quantity of laminated layers of the printed wiring board, for causing a computer to execute:
- a layer thickness calculation step of obtaining a mean thickness of an essential material forming a layer at each layer constructing a printed wiring board with respect to an area of the printed wiring board, and
- a laminate model forming step of forming a simple laminate model for predicting a displacement quantity according to its temperature change by laminating the layers each having a layer thickness calculated by the layer thickness calculation section.

13. The board design aiding program according to claim 12, wherein the layer thickness calculation step causes a computer to obtain a mean thickness of a first layer by including a volume of the same material as the essential material of the first layer in the second layer in the volume of the essential material of the first layer, when the same material as the essential material of the first layer is included in the second layer adjacent to the first layer.

14. The board design aiding program according to claim 12, comprising: a displacement quantity calculation step of calculating a displacement quantity generated upon change of a process temperature on the basis of physical property information for constructing respective layers for a laminate model formed by the laminate model forming step, to be executed by a computer.

15. A board design aiding program stored on a computer-readable medium which simplifies a designed printed wiring board to predict a displacement quantity of laminated layers of the printed wiring board, for causing a computer to execute:
- a layer thickness calculation step of obtaining a mean thickness of an essential material forming a layer at each layer constructing a printed wiring board with respect to an area of the printed wiring board, and
- a laminate model forming step of forming a simple laminate model by laminating the layers each having a layer thickness calculated by the layer thickness calculation section,
- wherein the concavo-convex information acquisition step causes a computer to acquire concavo-convex information about the printed wiring board by using a manufacturing line trend value obtained by quantizing the trend of bringing about a result different from the design value by the manufacturing process of the printed wiring board for the design value relating to the printed wiring board.

* * * * *